United States Patent
Nakatani

(12) 
(10) Patent No.: US 6,847,117 B2
(45) Date of Patent: Jan. 25, 2005

(54) SEMICONDUCTOR DEVICE INCLUDING A PASSIVATION FILM TO COVER DIRECTLY AN INTERFACE OF A BUMP AND AN INTERMEDIATED LAYER

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/206,593

(22) Filed: Jul. 24, 2002

(65) Prior Publication Data

US 2003/0030142 A1 Feb. 13, 2003

(30) Foreign Application Priority Data

Jul. 25, 2001 (JP) .................................... P. 2001-224726

(51) Int. Cl.$^7$ ............................................... H01L 23/48
(52) U.S. Cl. .................. 257/737; 257/738; 257/739; 257/741; 257/750; 257/786
(58) Field of Search ................................ 257/737, 738, 257/739, 741, 750, 786

(56) References Cited

U.S. PATENT DOCUMENTS 6,404,051 B1    6/2002   Ezawa et al. ................ 257/734

FOREIGN PATENT DOCUMENTS

| JP | 5-218039 | 8/1993 |
| JP | 2000-21914 | 1/2000 |

*Primary Examiner*—Nathan J. Flynn
*Assistant Examiner*—Remmon R. Fordé
(74) *Attorney, Agent, or Firm*—Merchant & Gould P.C.

(57) ABSTRACT

There are included a semiconductor substrate provided with a desirable element region, an electrode pad formed to come in contact with a surface of the semiconductor substrate or a wiring layer provided on the surface of the semiconductor substrate, a bump formed on a surface of the electrode pad through an intermediate layer, and a resin insulating film formed in at least a peripheral portion of the bump to cover an interface of the bump and the intermediate layer which is exposed to a side surface of the bump.

8 Claims, 7 Drawing Sheets

SEMICONDUCTOR DEVICE INCLUDING A PASSIVATION FILM TO COVER DIRECTLY AN INTERFACE OF A BUMP AND AN INTERMEDIATED LAYER

BACKGROUND OF THE INVENTION

1. Field of the Invention

The present invention relates to a semiconductor device and a method of manufacturing the semiconductor device, and more particularly to the passivation of the periphery of a bump to be formed on an electrode pad.

2. Description of the Related Art

When a semiconductor device such as a VLSI (very large scale integration) is to be manufactured, a passivation structure is very important around a bump formed on an electrode pad, and various endeavors have been made to enhance a productivity while maintaining a reliability.

In recent years, a structure using a polyimide resin for a passivation film has variously been proposed. By way of example, as shown in FIG. 15, there are formed an electrode pad 2 comprising an aluminum layer formed to come in contact with a surface of a semiconductor substrate 1 or a wiring layer provided on the surface of the semiconductor substrate, and a metal bump 6 formed in a contact hole H provided on a silicon nitride film 3 for covering the upper layer of the electrode pad 2 through a TiW layer to be an intermediate layer 4. The metal bump is formed on a thin metal layer formed by sputtering to be a seed layer 5 during plating, and a polyimide resin film 7 to be a passivation film is formed around the metal bump 6.

Such a structure is formed through the following manufacturing process.

First of all, a wiring layer (not shown) and an interlayer insulating film (not shown) are formed on the surface of the silicon substrate 1 provided with an element region and a through hole (not shown) is formed by photolithography. Then, the aluminum layer is evaporated and the wiring (not shown) and the electrode pad 2 are subjected to patterning by the photolithography. Thereafter, the silicon nitride film 3 is formed on the upper layer of the wiring and the electrode pad 2 and is subjected to patterning by the photolithography, and a contact hole H is formed in the central part of the electrode pad 2 to cover the peripheral edge of the electrode pad 2 with a silicon nitride film (FIG. 16).

As shown in FIG. 17, subsequently, the polyimide resin film 7 to be a passivation film is formed and is subjected to patterning, thereby exposing the electrode pad 2 as shown in FIG. 18.

If the aluminum layer is exposed to a surface, it is apt to be corroded. As shown in FIG. 19, therefore, a titanium tungsten TiW film to be a barrier layer is formed as the intermediate layer 4 on the aluminum layer by the sputtering method and the metal layer 5 to be a bonding pad is then formed.

As shown in FIG. 20, thereafter, the metal layer 5 and the intermediate layer 4 are subjected to patterning by the photolithography.

Accordingly, it is desirable that the edge of the pad layer 5 is coincident with that of the polyimide resin film 7. In consideration of mask precision, there is a problem in that the edges are coincident with difficulty. On the other hand, there is a problem in that a short circuit is apt to be caused if the metal layer 5 and the intermediate layer 4 get over the passivation film 7. For this reason, the patterning is carried out in consideration of precision in the photolithography.

As shown in FIG. 21, furthermore, the plated layer 6 is formed on the metal layer 5 by electroplating, thereby forming a bump.

As described above, in the method, a clearance is generated between the polyimide resin film constituting the passivation film and the metal layer 6 constituting the bump, and the TiW surface which is oxidized easily is exposed. For this reason, there is a problem in that corrosion is apt to be caused, the passivation effect cannot be obtained well and the reliability is thereby deteriorated.

In the conventional pad structure, thus, there is a problem in that a water content enters from the clearance between the passivation film and the bump, the electrode pad such as aluminum is easily corroded and the reliability is thereby maintained with difficulty.

SUMMARY OF THE INVENTION

The invention has been made in consideration of the circumstances and has an object to provide a semiconductor device comprising a pad having a passivation structure in which a resistance to a water content is high and a reliability is enhanced.

A first aspect of the invention is directed to a semiconductor device comprising a semiconductor substrate provided with a desirable element region, an electrode pad formed to come in contact with a surface of the semiconductor substrate or a wiring layer provided on the surface of the semiconductor substrate, a bump formed on a surface of the electrode pad through an intermediate layer, and a resin insulating film formed in at least a peripheral portion of the bump to cover an interface of the bump and the intermediate layer which is exposed to a side surface of the bump.

According to such a structure, the resin insulating film is formed to cover the interface of the bump and the intermediate layer which is exposed to the side surface of the bump. Therefore, the electrode pad and the intermediate layer which are provided as lower layers are not exposed but covered with the resin insulating film. Consequently, a reliability can be enhanced.

The intermediate layer includes a barrier metal layer such as TiW, an adhesion layer or a lower layer constituting a plated substrate. The invention is particularly effective in the case in which the layers are corrosive or are formed of materials which are easily oxidized.

It is desirable that the resin insulating film should be a polyimide resin film.

According to such a structure, it is possible to obtain a pad structure having a high reliability which can produce the insulation of the surface of the peripheral edge in the bump and a passivation effect by using the polyimide resin film.

It is desirable that the resin insulating film should be formed to have a higher level than the interface.

According to such a structure, it is possible to produce a passivation effect more reliably.

It is desirable that the intermediate layer should include a titanium tungsten (TiW) layer.

According to such a structure, there is such a drawback that the titanium tungsten (TiW) layer is particularly oxidized easily and a deterioration is apt to be caused if the interface is exposed. According to the invention, however, it is possible to easily obtain a bump structure having a high reliability.

It is desirable that the bump should be formed of metal.

According to such a structure, it is possible to obtain a semiconductor device having an excellent bonding property and a high reliability.

It is desirable that the electrode pad should be formed by a metal film containing aluminum.

There is such a drawback that the aluminum layer is particularly oxidized easily and a deterioration is apt to be caused if the interface is exposed. According to such a structure, however, it is possible to easily obtain a bump structure having a high reliability.

It is desirable that the electrode pad should be a thin copper film.

There is such a drawback that the copper layer is particularly oxidized easily and a deterioration is apt to be caused if the interface is exposed. According to such a structure, however, it is possible to easily obtain a bump structure having a high reliability.

It is desirable that the bump should be formed by a solder ball.

According to such a structure, it is possible to obtain an effective reliability in the case in which the bump is constituted by the solder ball as well as an ordinary columnar projection.

The invention provides a method of manufacturing a semiconductor device comprising the steps of forming an electrode pad to come in contact with a surface of a semiconductor substrate provided with a desirable element region or a wiring layer provided on the surface of the semiconductor substrate, forming an intermediate layer on a surface of the electrode pad, forming a seed layer on a surface of the intermediate layer, forming a resist pattern having a window in a bump formation region by photolithography, forming a bump on a surface of the seed layer exposed from the window of the resist pattern by a plating method, patterning the intermediate layer and the seed layer by using the bump as a mask, and forming a resin insulating film in at least a peripheral portion of the bump to cover an interface of the bump and the intermediate layer over a side surface of the bump.

According to such a structure, the bump is formed and the polyimide resin film is then provided. Therefore, it is possible to well cover the peripheral edge of the bump.

It is desirable that the step of forming a resin insulating film includes a step of applying a polyimide resin film.

According to such a structure, the resin insulating film is a polyimide resin film. Therefore, it is possible to obtain a surface structure which can easily be formed and has a high passivation effect.

It is desirable that the application should be carried out to have a higher level than the interface at the step of applying a resin insulating film.

According to such a structure, it is possible to well form a resin insulating film.

It is desirable that the step of forming an intermediate layer should include a step of forming a titanium tungsten (TiW) layer by a sputtering method.

There is such a drawback that the titanium tungsten (TiW) layer is particularly oxidized easily and a deterioration is apt to be caused if the interface is exposed. According to such a structure, however, it is possible to easily obtain a bump structure having a high reliability.

It is desirable that the step of forming a seed layer should include a step of forming a metal layer by sputtering, and the step of forming a bump includes a step of forming a bump comprising a metal layer on the seed layer by electroplating.

According to such a structure, it is possible to form a metal bump more efficiently.

It is desirable that the step of forming an intermediate layer should include a step of forming a thin chromium film, the step of forming a seed layer should include a step of sputtering a nickel layer, and the step of forming a bump should include a step of mounting a solder ball on the nickel layer and fusing an interface of the nickel layer and the solder ball, a step of removing the resist pattern and patterning the intermediate layer and the seed layer by using the solder ball as a mask, and a step of forming a polyimide resin film to cover an interface of the solder ball and the intermediate layer.

According to such a structure, it is possible to form the polyimide resin film to well cover the interface of the intermediate layer without exposing the same interface when forming the solder ball. Therefore, it is possible to form a solder ball having a high reliability.

The bump indicates a columnar projection or a projection such as a solder ball.

DESCRIPTION OF THE PREFERRED EMBODIMENTS

Figure 1:
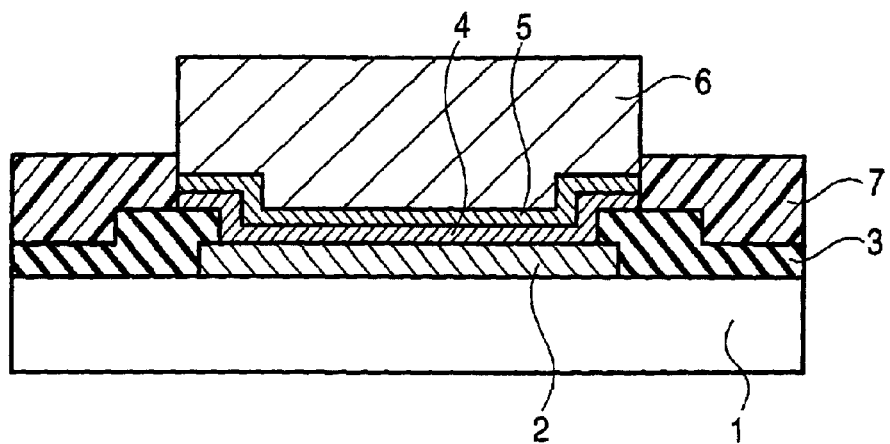
FIG. 1 is a view showing a semiconductor device according to a first embodiment of the invention.

FIG. 1 is a view illustrating a semiconductor device having a pad structure according to a first embodiment of the invention, and FIGS. 2 to 11 are views illustrating a process for manufacturing the semiconductor device according to the first embodiment of the invention.

This structure is characterized in that there are included an electrode pad 2 formed on the surface of a silicon substrate 1 provided with a desirable element region and a bump 6 formed on the surface of the electrode pad through a titanium tungsten layer to be an intermediate layer 4 and a resin insulating film formed of a polyimide resin film 7 is provided in the peripheral portion of the bump 6 to cover the interface of the bump 6 and the intermediate layer 4 which is exposed to the side surface of the bump 6.

The metal layer 5 is a film to be a plated substrate, and the polyimide resin film 7 is formed to have a higher level than the interface of the intermediate layer 4 and the metal layer 5.

Next, description will be given to the process for manufacturing the semiconductor device according to the first embodiment of the invention.

As shown in FIG. 1, first of all, a semiconductor substrate 1 having a field oxide film (not shown) formed thereon is prepared, and an element region such as an MOSFET comprising a polysilicon gate is formed on the field oxide film and the semiconductor substrate.

Next, an interlayer insulating film (not shown) is formed to cover the surface. The interlayer insulating film is constituted by PSG (a silicon oxide film doped with phosphorus) or BPSG (a silicon oxide film doped with boron and phosphorus), for example. Then, an aluminum wiring having a thickness of 500 to 1000 nm is formed on the interlayer insulating film. Thus, the aluminum wiring is formed on the semiconductor substrate 1 and is then subjected to patterning, thereby forming the electrode pad 2.

Thereafter, a silicon nitride film 3 is formed by a sputtering method and a window is formed to be opened to the electrode pad 2.

Figure 2:
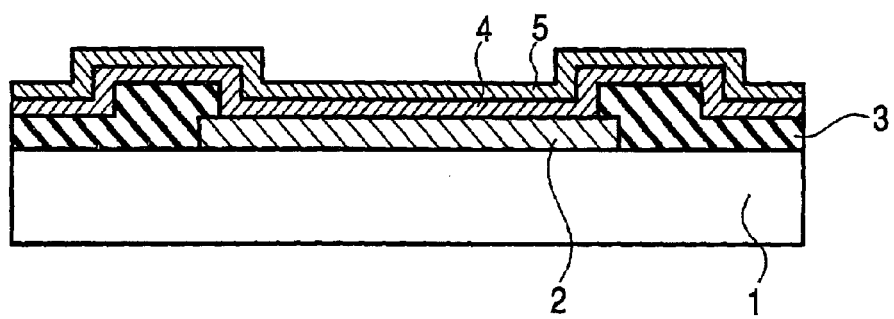
FIG. 2 is a view showing a process for manufacturing a semiconductor device according to the first embodiment of the invention.

As shown in FIG. 2, subsequently, the TiW layer 4 having a thickness of 200 nm is formed on the electrode pad 2 and the silicon nitride film 3 by the sputtering method and the metal layer having a thickness of 200 nm is then formed.

Figure 3:
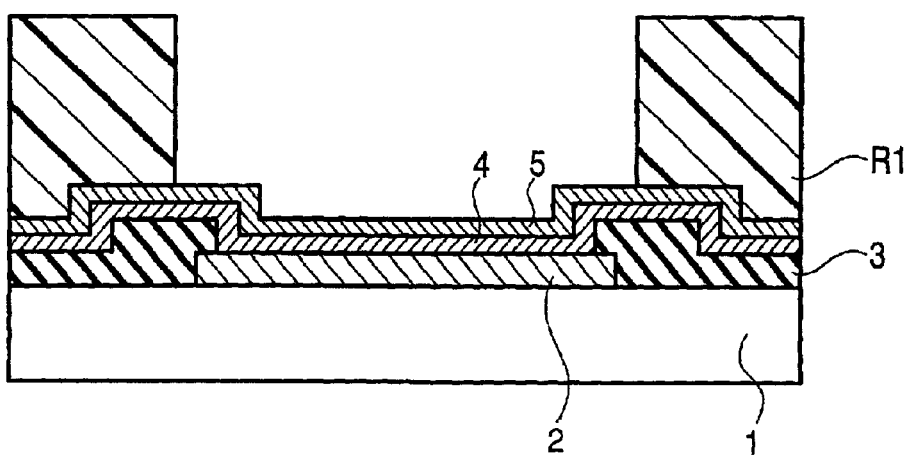
FIG. 3 is a view showing the process for manufacturing a semiconductor device according to the first embodiment of the invention.

As shown in FIG. 3, thereafter, a resist is applied to form a resist pattern R1 by photolithography.

Figure 4:
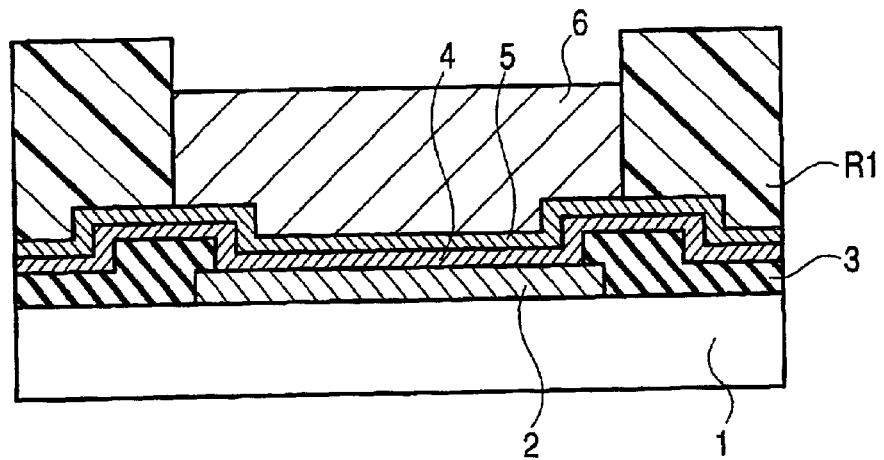
FIG. 4 is a view showing the process for manufacturing a semiconductor device according to the first embodiment of the invention.

As shown in FIG. 4, subsequently, a bump is formed on the metal layer 5 exposed from the resist pattern R1 by electroplating using the resist pattern R1 as a mask.

Figure 5:
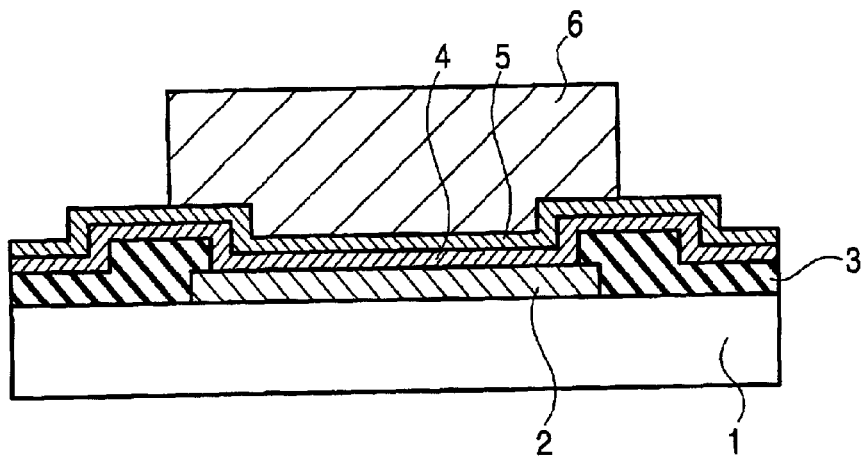
FIG. 5 is a view showing the process for manufacturing a semiconductor device according to the first embodiment of the invention.

As shown in FIG. 5, then, the resist pattern R1 is peeled to expose the bump 6.

Figure 6:
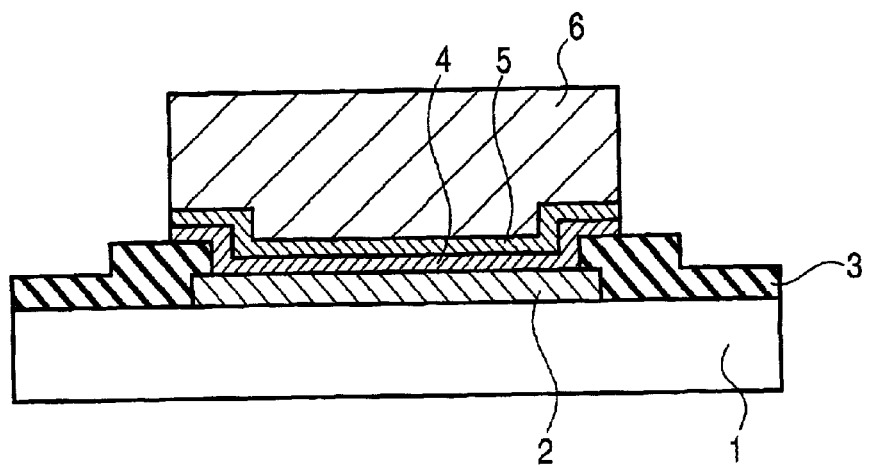
FIG. 6 is a view showing the process for manufacturing a semiconductor device according to the first embodiment of the invention.

As shown in FIG. 6, furthermore, the metal is slightly etched such that the metal layer 5 provided on the silicon nitride layer 3 can be removed, and furthermore, the TiW layer 4 is etched by using the metal bump 6 as a mask.

Figure 7:
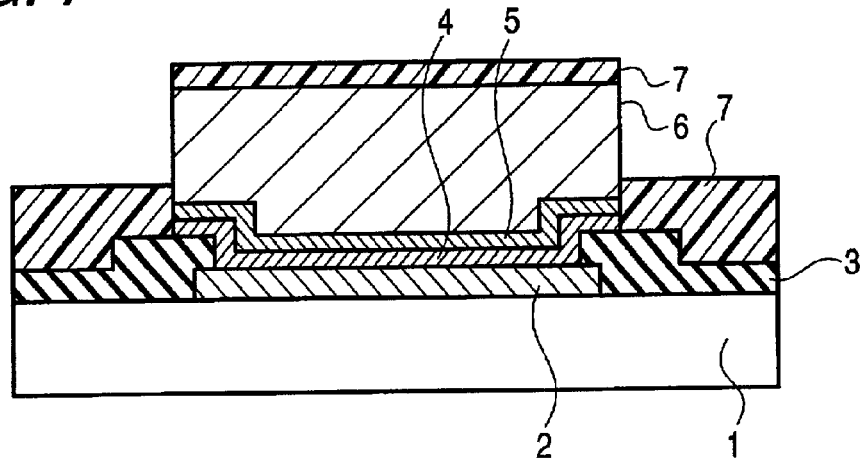
FIG. 7 is a view showing the process for manufacturing a semiconductor device according to the first embodiment of the invention.

As shown in FIG. 7, thereafter, the photosensitive polyimide resin 7 is applied. At this time, the polyimide resin 7 is also formed thinly on the bump 6.

Figure 8:
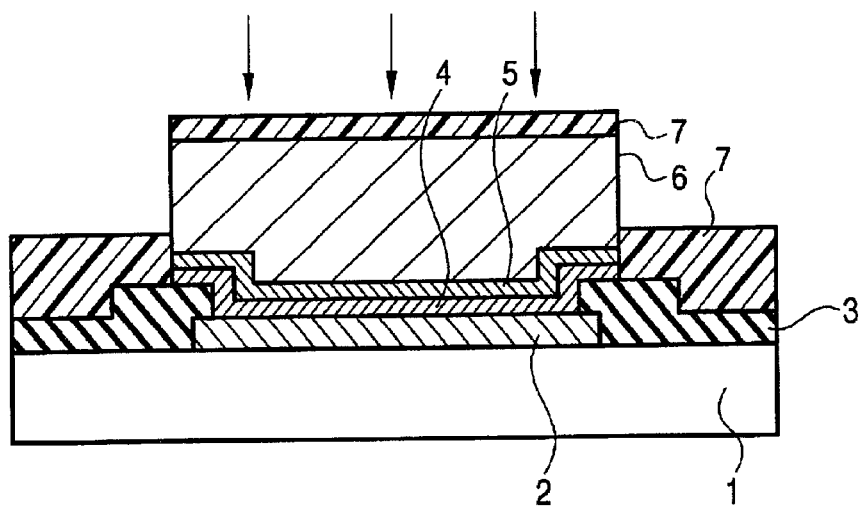
FIG. 8 is a view showing the process for manufacturing a semiconductor device according to the first embodiment of the invention.

As shown in FIG. 8, subsequently, exposure is carried out by using a pattern formed to remove the polyimide resin 7 provided on the bump simultaneously with the formation of a scribe line (not shown). Since the polyimide resin 7 has a small thickness on the bump, it does not need to be removed.

Figure 9:
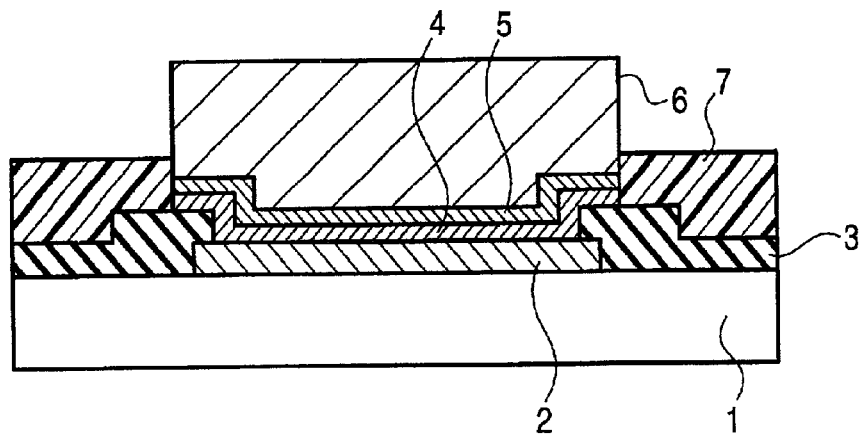
FIG. 9 is a view showing the process for manufacturing a semiconductor device according to the first embodiment of the invention.

As shown in FIG. 9, then, ashing is carried out to completely remove the photosensitive polyimide resin 7 provided on the bump 6.

Figure 10:
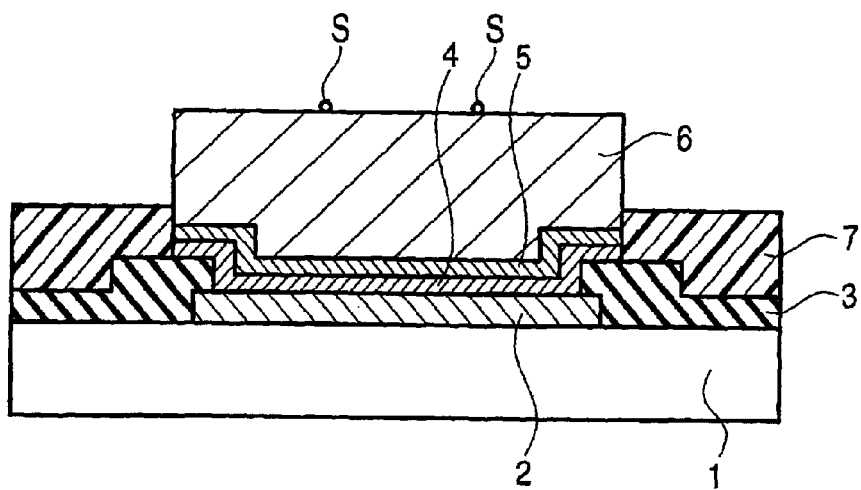
FIG. 10 is a view showing the process for manufacturing a semiconductor device according to the first embodiment of the invention.

As shown in FIG. 10, furthermore, the polyimide resin is postbaked by a heat treatment at 300° C. for 30 minutes, thereby enhancing the quality of the film.

Figure 11:
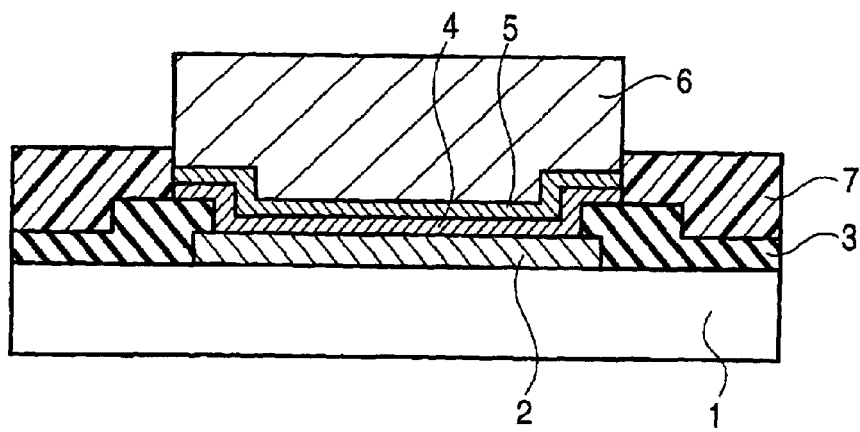
FIG. 11 is a view showing the process for manufacturing a semiconductor device according to the first embodiment of the invention.

As shown in FIG. 11, finally, an $O_2$ plasma treating step is carried out in order to remove polymer or particles (dust) caused at an etch back step after the etch back step.

Thus, a semiconductor device having the pad structure shown in FIG. 1 is formed.

According to such a structure, the polyimide resin film 7 is formed to cover the interface of the bump 6 and the TiW layer to be the intermediate layer 4 which is exposed to the side surface of the bump. Therefore, the lower electrode pad 2 and the intermediate layer 4 are not exposed but are well covered and protected by the polyimide resin film so that a pad structure having a long lifetime and a high reliability can be obtained.

Moreover, after the bump is formed, the polyimide resin film 7 is formed. Therefore, it is possible to cover the interface efficiently and well.

While the description has been given to the case in which the metal bump is formed in the first embodiment, another layer such as Ti/TiN may be used as the intermediate layer, and furthermore, an adhesion layer such as a titanium layer or a palladium layer can also be provided.

Furthermore, the pad electrode is not restricted to aluminum but the invention can also be applied to the case in which the pad electrode is formed of aluminum-silicon (Al—Si), aluminum-silicon-copper (Al—Si—Cu) or copper (Cu).

Next, a second embodiment of the invention will be described.

Figure 12:
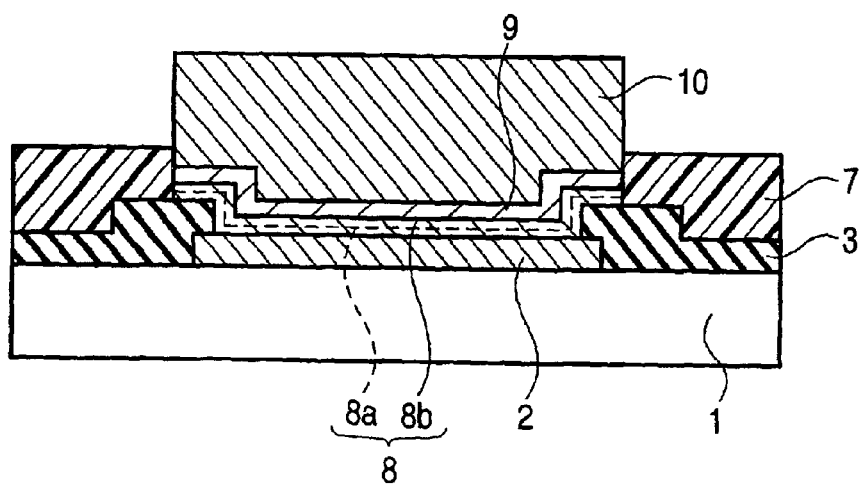
FIG. 12 is a view showing a semiconductor device according to a second embodiment of the invention.

FIG. 12 is a view showing a semiconductor device according to the second embodiment of the invention. While the metal bump has been described in the above-mentioned embodiment, a solder bump will be described in this example.

In this example, the electrode pad 2 is formed of aluminum in the same manner as in the first embodiment, and an intermediate layer to be formed as an upper layer includes a barrier layer 8a formed by a titanium layer and a nickel layer 8b to be an adhesion layer, and furthermore, a solder bump 10 comprising a solder plated layer is formed as an upper layer through a chromium layer 9 to be a seed layer.

The manufacturing process according to the second embodiment is the same as that of the first embodiment except that it is necessary to set a treating temperature to be low because the melting point of a solder is low.

Also in this case, there is a problem in that a chromium layer is easily oxidized and corrosion is increased on an interface. According to the embodiment, it is possible to easily obtain a pad structure having a high reliability.

Next, a third embodiment of the invention will be described.

Figure 13:
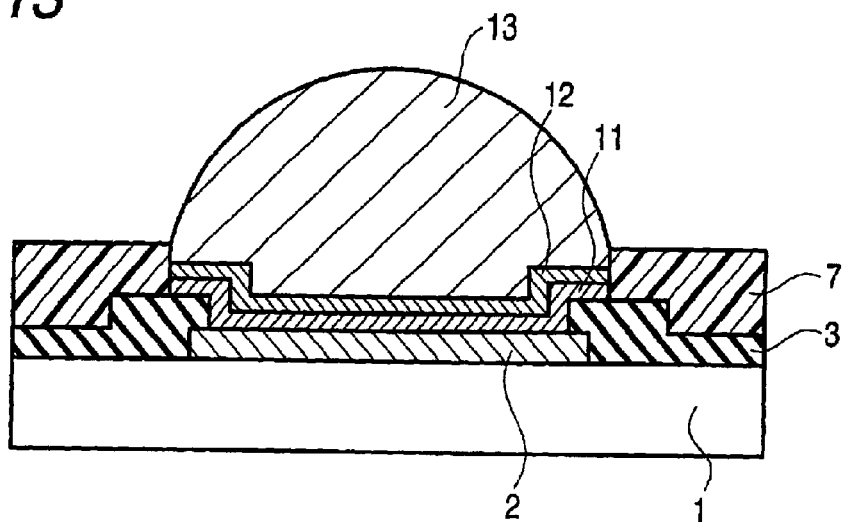
FIG. 13 is a view showing a semiconductor device according to a third embodiment of the invention.

FIG. 13 is a view showing a semiconductor device according to the third embodiment of the invention. While the bump has been described in the first and second embodiments, description will be given to an example in which a solder ball is used.

This example is characterized in that a bump to be a columnar projection is a ball-shaped solder (hereinafter referred to as a solder ball 13), and a Ti layer 11 and a nickel layer 12 are formed, the solder ball 13 is then mounted, the interface of the nickel layer and the solder ball is fused, and a polyimide resin film 7 is thereafter formed.

Others are the same as those in the first and second embodiments.

Next, description will be given to a process for manufacturing a semiconductor device having the pad structure.

After an electrode pad 2 and a silicon nitride film 3 to be an upper layer are formed. In the same manner as in FIG. 2, then, the Ti layer 11 having a thickness of 300 nm is formed on the electrode pad 2 and the silicon nitride film 3 by a sputtering method and the nickel layer 12 having a thickness of 200 nm is then formed.

In the same manner as shown in FIG. 3, thereafter, a resist is applied to form a resist pattern R1 by photolithography.

Subsequently, the solder ball 13 is mounted on the nickel layer 12 exposed from the resist pattern R1, a heat treatment is carried out at 150° C. and the interface of the nickel layer 12 and the solder ball 13 is fused.

In the same manner as shown in FIG. 5, then, the resist pattern R1 is peeled to expose a solder ball 6.

In the same manner as shown in FIG. 6, furthermore, etching is slightly carried out such that the Ti layer and the nickel layer which are provided on the silicon nitride layer 3 can be removed.

In the same manner as shown in FIG. 7, thereafter, the photosensitive polyimide resin 7 is applied. In the same manner as in the first embodiment, subsequently, the polyimide resin 7 provided on the solder ball 13 is removed so that a pad structure shown in FIG. 13 is formed.

Thus, it is possible to obtain a pad structure having a long lifetime and a high reliability.

Next, a fourth embodiment of the invention will be described.

Figure 14:
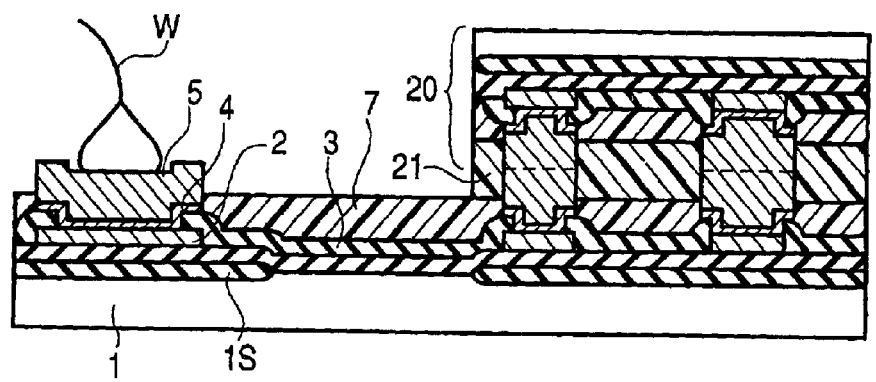
FIG. 14 is a view showing a semiconductor device according to a fourth embodiment of the invention.
Figure 15:
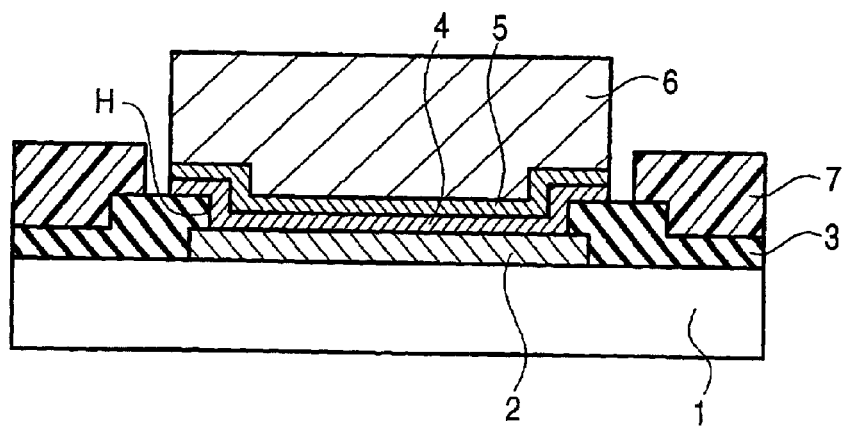
FIG. 15 is a view showing a semiconductor device according to a conventional example.
Figure 16:
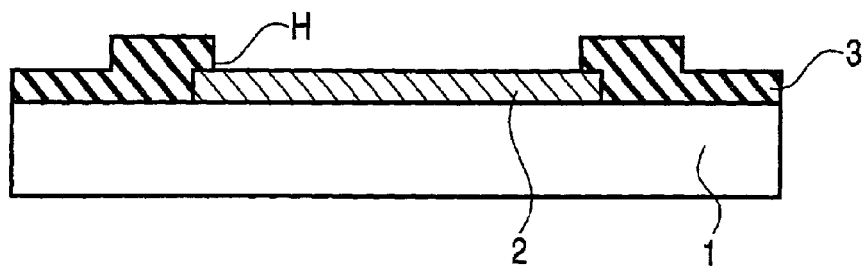
FIG. 16 is a view showing a process for manufacturing a semiconductor device according to the conventional example.
Figure 17:
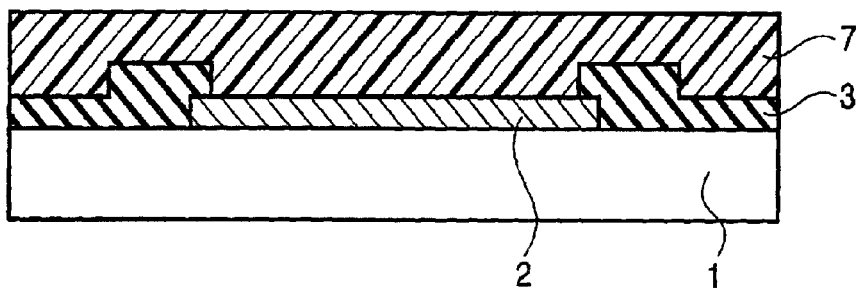
FIG. 17 is a view showing the process for manufacturing a semiconductor device according to the conventional example.
Figure 18:
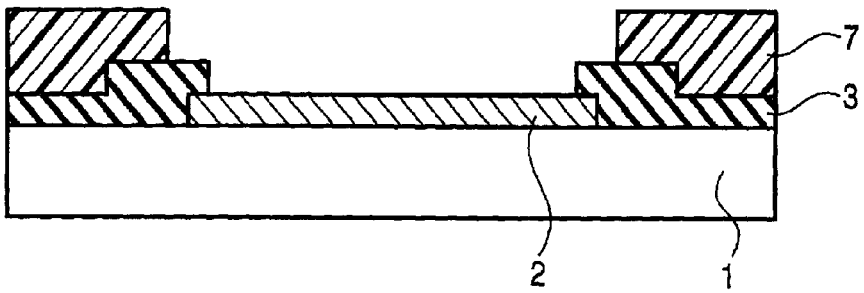
FIG. 18 is a view showing the process for manufacturing a semiconductor device according to the conventional example.
Figure 19:
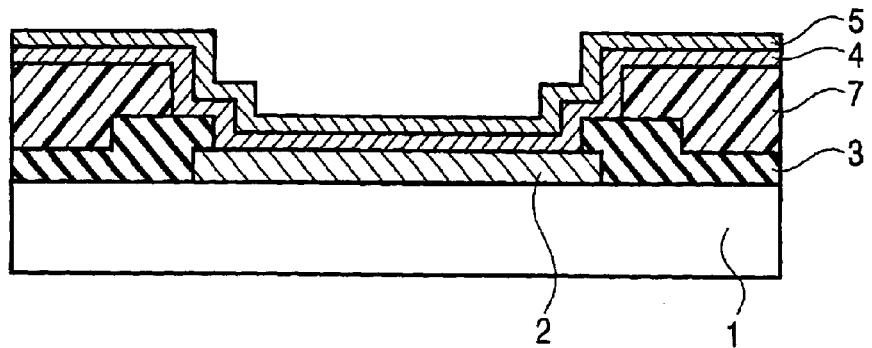
FIG. 19 is a view showing the process for manufacturing a semiconductor device according to the conventional example.
Figure 20:
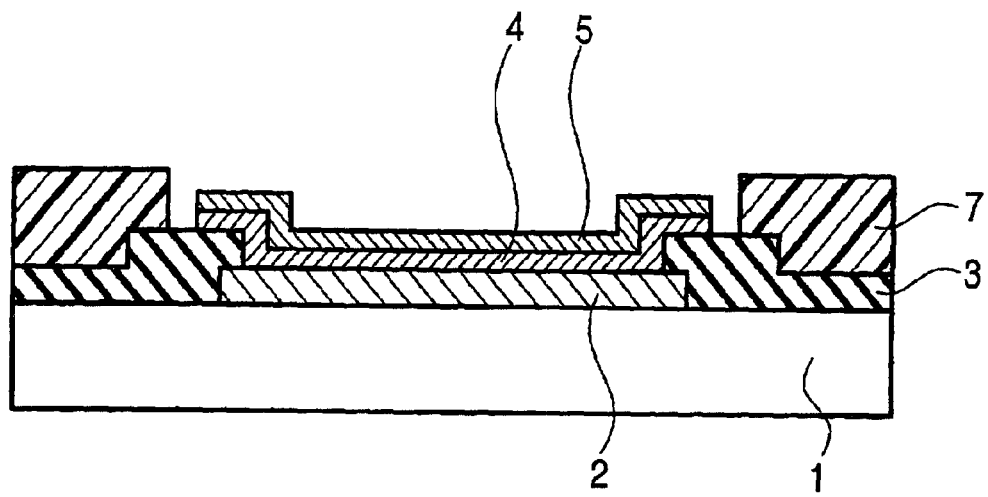
FIG. 20 is a view showing the process for manufacturing a semiconductor device according to the conventional example.
Figure 21:
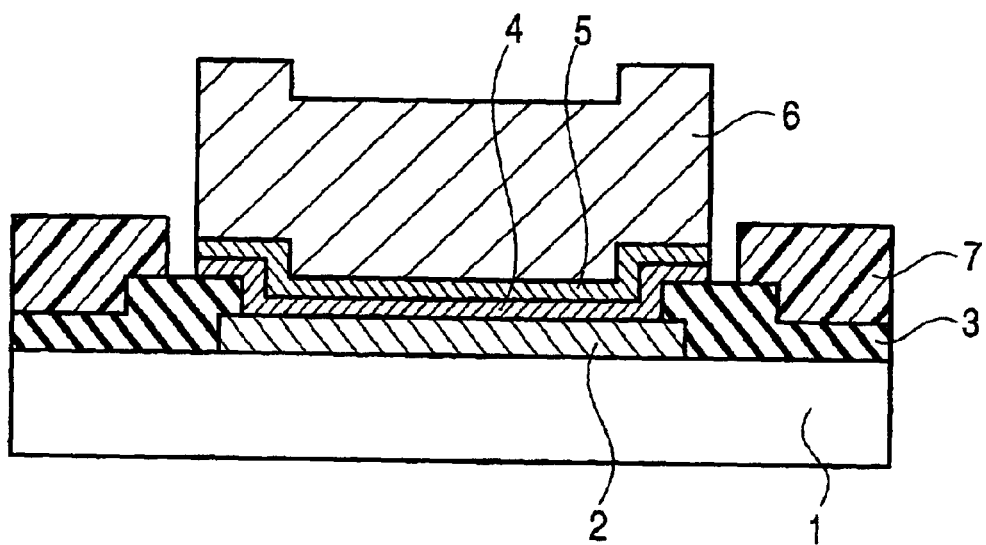
FIG. 21 is a view showing the process for manufacturing a semiconductor device according to the conventional example.

FIG. 14 is a view showing a semiconductor device according to a fourth embodiment of the invention. In this example, a semiconductor chip 20 is directly connected onto a semiconductor chip 1, while a bonding wire W is connected to a bump 5 formed on the surface of the semiconductor chip 1 and the other end of the bonding wire W is connected to a mounting substrate (not shown) such as a lead frame.

Others are the same as those in the first to third embodiments.

According to such a structure, a bonding pad and a bump are formed such that side surfaces are covered with a polyimide resin 7 at the same bump forming step. Therefore, it is possible to form a film having a great resistance to a water content and a high reliability.

While a lower wiring layer constituted by a field oxide film and an aluminum wiring formed thereon has been taken as an example of a lower layer in the embodiment, the lower layer is not restricted thereto. The lower layer in the invention signifies a general layer having a concavo-convex surface.

As described above, in the invention, the resin insulating film is formed to cover the interface of the bump and the intermediate layer which is exposed to the side surface of the bump. Therefore, the electrode pad and the intermediate layer which are the lower layers are not exposed but covered with the resin insulating film. Consequently, it is possible to increase a lifetime and to enhance a reliability in a semiconductor device.

According to the method of the invention, moreover, the bump is formed and the resin insulating film is then formed. Therefore, the resin insulating film can be formed in order to well cover the interface of the bump and the intermediate layer, and the electrode pad and the intermediate layer which are the lower layers are not exposed but covered with the resin insulating film. Thus, it is possible to increase a lifetime and to enhance a reliability.

What is claimed is:

1. A semiconductor device comprising:
    a semiconductor substrate provided with a desirable element region;
    an electrode pad formed to come in contact with a surface of the semiconductor substrate or a wiring layer provided on the surface of the semiconductor substrate;
    a bump formed on a surface of the electrode pad through an intermediate layer; and
    a resin insulating film formed in at least a peripheral portion of the bump to cover directly an interface of the bump and the intermediate layer which is exposed to a side surface of the bump.

2. The semiconductor device according to claim 1, wherein the resin insulating film is a polyimide resin film.

3. The semiconductor device according to claim 1, wherein the resin insulating film is formed to have a higher level than the interface.

4. The semiconductor device according to claim 1, wherein the intermediate layer includes a titanium tungsten (TiW) layer.

5. The semiconductor device according to claim 1, wherein the bump is formed of metal.

6. The semiconductor device according to claim 1, wherein the electrode pad is formed by a metal film containing aluminum.

7. The semiconductor device according to claim 1, wherein the electrode pad is a thin copper film.

8. The semiconductor device according to claim 1, wherein the bump is formed by a solder ball.

* * * * *